United States Patent
Gable et al.

(10) Patent No.: US 10,372,166 B2
(45) Date of Patent: Aug. 6, 2019

(54) COUPLING STRUCTURES FOR ELECTRONIC DEVICE HOUSINGS

(71) Applicant: Apple Inc., Cupertino, CA (US)

(72) Inventors: Brian M. Gable, Cupertino, CA (US); Carlo Di Nallo, Cupertino, CA (US); Colin M. Ely, Cupertino, CA (US); Craig A. Horton, Cupertino, CA (US); Erik G. de Jong, Cupertino, CA (US); Fletcher R. Rothkopf, Cupertino, CA (US); Henry B. Wettersten, Cupertino, CA (US); Hoishun Li, Cupertino, CA (US); Jason C. Sauers, Cupertino, CA (US); Jayesh Nath, Cupertino, CA (US); Mario Martinis, Cupertino, CA (US); Mattia Pascolini, Cupertino, CA (US); Michael P. Coleman, Cupertino, CA (US); Rex T. Ehman, Cupertino, CA (US); Zheyu Wang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/212,029

(22) Filed: Jul. 15, 2016

(65) Prior Publication Data
US 2018/0017995 A1    Jan. 18, 2018

(51) Int. Cl.
*G06F 1/16* (2006.01)
*H01Q 1/22* (2006.01)
(Continued)

(52) U.S. Cl.
CPC .......... *G06F 1/1656* (2013.01); *B29C 70/763* (2013.01); *H01Q 1/22* (2013.01);
(Continued)

(58) Field of Classification Search
None
See application file for complete search history.

(56) References Cited

U.S. PATENT DOCUMENTS

| 4,567,318 A | 1/1986 | Shu |
| 6,532,152 B1 * | 3/2003 | White ............... G02F 1/133308 312/223.1 |

(Continued)

FOREIGN PATENT DOCUMENTS

| CN | 202540623 | 11/2012 |
| EP | 1225652 | 7/2002 |
| EP | 2838157 | 2/2015 |

OTHER PUBLICATIONS

Invitation to Pay Additional Fees, PCT/US2017/041545, 16 pages, dated Oct. 18, 2017.

*Primary Examiner* — Binh B Tran
*Assistant Examiner* — Douglas R Burtner
(74) *Attorney, Agent, or Firm* — Brownstein Hyatt Farber Schreck, LLP

(57) ABSTRACT

A housing for an electronic device is disclosed. The housing includes a first conductive component defining a first interface surface, a second conductive component defining a second interface surface facing the first interface surface, and a joint structure between the first and second interface surfaces. The joint structure includes a molded element forming a portion of an exterior surface of the housing, and a sealing member forming a watertight seal between the first and second conductive components. Methods of forming the electronic device housing are also disclosed.

15 Claims, 14 Drawing Sheets

(51) Int. Cl.
*H04B 1/3888* (2015.01)
*H04M 1/02* (2006.01)
*H05K 5/00* (2006.01)
*H05K 5/04* (2006.01)
*B29C 70/76* (2006.01)
*H01Q 1/24* (2006.01)
*H01Q 21/28* (2006.01)
*H04M 1/18* (2006.01)
*B29L 31/34* (2006.01)

(52) U.S. Cl.
CPC ............ *H01Q 1/243* (2013.01); *H01Q 21/28* (2013.01); *H04B 1/3888* (2013.01); *H04M 1/0202* (2013.01); *H04M 1/0249* (2013.01); *H04M 1/18* (2013.01); *H05K 5/0013* (2013.01); *H05K 5/04* (2013.01); *B29L 2031/3481* (2013.01); *G06F 1/163* (2013.01); *G06F 1/1637* (2013.01)

(56) References Cited

U.S. PATENT DOCUMENTS

| | | | |
|---|---|---|---|
| 6,625,394 B2 | 9/2003 | Smith et al. | |
| 7,377,767 B2 | 5/2008 | Dubuis et al. | |
| 7,684,178 B2 | 3/2010 | Hsu et al. | |
| 7,713,054 B2 | 5/2010 | Mai | |
| 7,798,804 B2 | 9/2010 | Kmoch et al. | |
| 7,829,786 B2 | 11/2010 | Fuerstenberg et al. | |
| 8,191,756 B2 | 6/2012 | Coppeta et al. | |
| 8,380,258 B2 | 2/2013 | Kim et al. | |
| 8,519,286 B1 | 8/2013 | Bloch | |
| 8,537,543 B2 | 9/2013 | Wang et al. | |
| 8,620,395 B2 | 12/2013 | Kang et al. | |
| 8,654,029 B2 | 2/2014 | Fan et al. | |
| 8,665,160 B2 | 3/2014 | Uttermann et al. | |
| 8,773,847 B2 | 7/2014 | Byun et al. | |
| 8,884,826 B2 | 11/2014 | Wu et al. | |
| 8,947,303 B2 | 2/2015 | Golko et al. | |
| 8,980,026 B2 | 3/2015 | Ely | |
| 9,036,358 B2 | 5/2015 | Shoji et al. | |
| 9,146,588 B2 | 9/2015 | Kole et al. | |
| 9,229,675 B2 | 1/2016 | Beeze et al. | |
| 9,282,657 B2 | 3/2016 | Miyaoka et al. | |
| 9,338,910 B2 | 5/2016 | Hattori | |
| 9,360,889 B2 | 6/2016 | Idsinga et al. | |
| 9,408,009 B1* | 8/2016 | Witte | H04R 1/028 |
| 9,537,526 B2 | 1/2017 | Wilson et al. | |
| 9,578,145 B2* | 2/2017 | Chang | H04M 1/0202 |
| 9,591,110 B2 | 3/2017 | Hill et al. | |
| 9,606,579 B2 | 3/2017 | Pakula et al. | |
| 9,680,206 B2 | 6/2017 | Youn et al. | |
| 9,791,893 B2* | 10/2017 | Yamaguchi | G06F 1/1656 |
| 9,795,044 B2* | 10/2017 | Lai | H04R 1/02 |
| 10,144,000 B2 | 12/2018 | Goyal et al. | |
| 2006/0115323 A1* | 6/2006 | Coppeta | A61K 9/0097 403/270 |
| 2008/0268083 A1 | 10/2008 | Ferenc | |
| 2009/0071748 A1* | 3/2009 | Fuerstenberg | H05K 5/06 181/292 |
| 2009/0141436 A1 | 6/2009 | Matsuoka et al. | |
| 2010/0230155 A1 | 9/2010 | Hashizume et al. | |
| 2011/0076883 A1* | 3/2011 | Jol | B29C 45/1671 439/521 |
| 2012/0099261 A1* | 4/2012 | Reber | G06F 1/1632 361/679.3 |
| 2012/0157175 A1* | 6/2012 | Golko | G06F 1/1698 455/575.7 |
| 2012/0319907 A1 | 12/2012 | Wu et al. | |
| 2013/0107425 A1* | 5/2013 | Wright | H04M 1/0202 361/679.01 |
| 2013/0235538 A1* | 9/2013 | Hashimoto | H05K 5/06 361/752 |
| 2013/0242477 A1* | 9/2013 | Hattori | H04M 1/026 361/679.01 |
| 2013/0271902 A1* | 10/2013 | Lai | H04R 1/02 361/679.01 |
| 2013/0314863 A1* | 11/2013 | Tanaka | H04M 1/18 361/679.01 |
| 2013/0329460 A1* | 12/2013 | Mathew | H05K 5/02 362/612 |
| 2013/0342970 A1* | 12/2013 | Franklin | G06F 1/1643 361/679.01 |
| 2014/0004294 A1 | 1/2014 | Christophy et al. | |
| 2014/0023430 A1 | 1/2014 | Prest et al. | |
| 2014/0152890 A1* | 6/2014 | Rayner | G06F 1/1626 348/376 |
| 2014/0206420 A1* | 7/2014 | Neichi | H04M 1/0249 455/575.8 |
| 2014/0266939 A1* | 9/2014 | Baringer | H01Q 21/28 343/729 |
| 2014/0334077 A1 | 11/2014 | Kwong | |
| 2015/0050968 A1* | 2/2015 | Jeon | C25D 5/48 455/575.1 |
| 2015/0062807 A1* | 3/2015 | Gwin | G06F 1/1656 361/679.55 |
| 2015/0093527 A1* | 4/2015 | Montevirgen | B29C 45/14467 428/35.7 |
| 2015/0257285 A1* | 9/2015 | Wilson | H04M 1/18 224/235 |
| 2015/0341072 A1* | 11/2015 | Lai | H04B 1/3888 455/575.8 |
| 2016/0011629 A1* | 1/2016 | Yamaguchi | G06F 1/1656 361/679.56 |
| 2017/0094811 A1 | 3/2017 | Shi et al. | |
| 2017/0196110 A1* | 7/2017 | Shinn | H05K 5/061 |
| 2017/0205847 A1* | 7/2017 | Wagman | G06F 1/1643 |
| 2017/0279943 A1* | 9/2017 | Hill | H04M 1/0249 |
| 2018/0081400 A1* | 3/2018 | Pandya | G06F 1/1656 |
| 2018/0081408 A1* | 3/2018 | Lilje | G06F 1/182 |
| 2018/0160551 A1 | 6/2018 | Shi et al. | |
| 2019/0036201 A1 | 1/2019 | Hill et al. | |

\* cited by examiner

COUPLING STRUCTURES FOR ELECTRONIC DEVICE HOUSINGS

FIELD

The subject matter of this disclosure relates generally to coupling structures for electronic device housings, and more particularly to coupling structures providing watertight joints between components or segments of electronic device housings.

BACKGROUND

Electronic device housings often include multiple components that are coupled together to form the housing. For example, two or more housing components may be coupled together to form an outer or exterior surface of the housing and to form an interior cavity or volume in which components of the electronic device are housed. The housing may also include joint structures or other intermediate components positioned between the housing components. The joint structures may form part of an exterior surface of the housing along with the housing components. The housing and joint structures may be formed from various materials, such as metal, plastic, or the like.

SUMMARY

A housing for an electronic device includes a first conductive component defining a first interface surface, a second conductive component defining a second interface surface facing the first interface surface, and a joint structure between the first and second interface surfaces. The joint structure includes a molded element forming a portion of an exterior surface of the housing, and a sealing member abutting the molded element and forming a watertight seal between the first and second conductive components.

A method of manufacturing a housing for an electronic device includes positioning a sealing member in a first portion of a gap between a first component and a second component, thereby forming a watertight seal between the first and second components, introducing a joining material into a second portion of the gap, and curing the joining material to form a molded element defining a portion of an exterior surface of the housing. In some embodiments, the operation of positioning the sealing member in the first portion of the gap occurs after the operation of curing the joining material to form the molded element, and the operation of introducing the joining material into the second portion of the gap includes flowing the joining material into the first and second portions of the gap, curing the joining material to form a hardened joining material, and removing at least part of the hardened joining material from the first portion of the gap, thereby forming the molded element.

A housing for an electronic device includes a first housing component comprising a conductive material and forming a first portion of an exterior surface of the housing, and a second housing component attached to the first housing component via a watertight joint. The second housing component includes a nonconductive structural member coupled to the first housing component and forming a second portion of the exterior surface of the housing, and a conductive coating on at least a portion of the structural member and forming a third portion of the exterior surface of the housing.

A method of manufacturing a housing for an electronic device includes coupling a first housing component to a second housing component to form a housing having an exterior surface defined at least in part by a portion of the first housing component and a portion of the second housing component, and removing a portion of a conductive coating from the first housing component to expose a substantially nonconductive material under the coating.

A method of manufacturing a housing for an electronic device includes removing material from a housing blank comprising a nonconductive component positioned between and bonded to a first and a second conductive component to form at least an exterior surface of the housing and an interior volume adapted to receive components of the electronic device. After the material is removed, the nonconductive component electrically isolates the first conductive component from the second conductive component, and the interface between the nonconductive component and a surface of the first conductive component is watertight.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
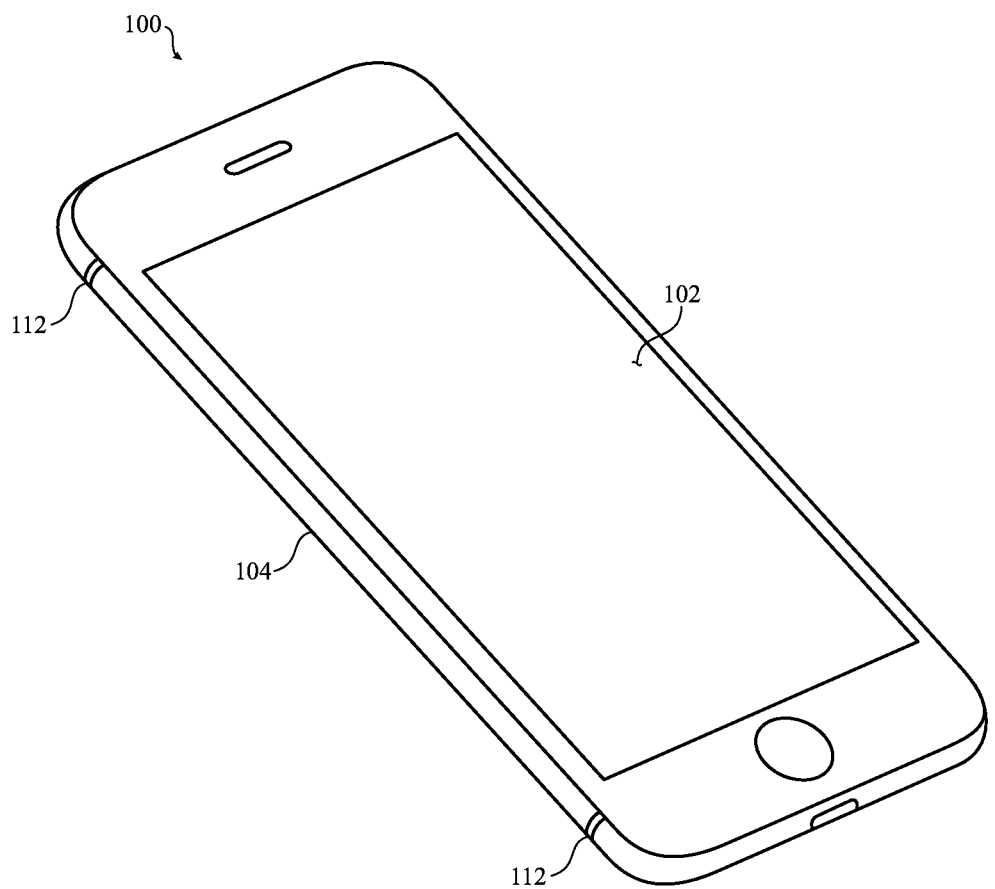
FIG. 1A shows an example electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Housings for electronic devices may include multiple different components. For example, a housing may include a first component that forms a back surface of the housing and a second component that forms a front portion (e.g., a support or frame for supporting a display screen). In order to join the first and second components (and/or to provide other functionality), an intermediate or joining structure formed from a polymer or other suitable material may be positioned between the components. For example, a polymer material in a viscous or flowable state may be introduced into a gap between the housing components and then cured to retain the housing components together. Alternatively, a gasket or other structure may be positioned in the gap and glued or otherwise adhered to the housing components. In some cases, a housing component may be a conductive element that is part of an electrical circuit of the device. In such cases, an intermediate or joining structure may electrically isolate the electrically operative housing component from other housing components. For example, a housing component may act as an antenna for a wireless communication circuit of the electronic device, and an intermediate or joining structure may electrically isolate that component from other conductive housing components to facilitate proper antenna function.

Electronic devices, such as handheld and wearable electronic devices, are often subjected to liquids that, if allowed to enter the device housing, could damage sensitive electric components inside the housing. Where housings are formed from multiple different components joined, it may be advantageous to provide joints between the components that are watertight. As used herein, the term "watertight" refers to the ability of a joint, seal, seam, or interface to prevent water or other liquids from passing therethrough under an anticipated or particular set of conditions. For example, a joint, seal, or interface may be considered watertight when it prevents the passage of water at a particular pressure or water depth (e.g., 10 mbar) for a particular duration (e.g., 1 hour). Other pressure and duration combinations may also be used, such as immersion at 1 m for 30 minutes and/or being subjected to water jets directed to the device. Other measures, classifications, or standards for watertightness or water resistance may also be used, such as the International Organization for Standardization (ISO) 2281 or 6425 standards, International Electrotechnical Commission (IEC) IPX1-IPX9K standards, or water pressure ratings (e.g., the ability to withstand water pressures up to a value ranging from 1-20 ATM). In general, a joint, seal, seam, or interface may be considered watertight if it prevents the passage of water under foreseeable uses or misuses of an electronic device, such as being worn while swimming or showering, being subjected to sweat, rain, or spills, being dropped into standing water, and the like. Where a joint, seal, seam, or interface is described herein as being watertight, it may comply with any one or more of the aforementioned standards, measures, or classifications.

As noted above, housings may include multiple housing components joined to one another by joint structures. The joint structures may provide various functions. For example, the joint structures may mechanically retain the housing components together while also electrically isolating the housing components from one another. Described herein are various housings where joints or seams between the joint structures and the housing components are watertight. For example, in order to form a watertight housing, a joint structure may include multiple elements, such as an outer element that provides structural and/or cosmetic functionality and forms part of an external surface of the housing, as well as an inner element that provides a watertight seal. The inner element may be, for example, a gasket, O-ring, or other elastomeric or deformable material that is compressed between the housing components. As another example, the inner element may be a sealant, adhesive, or other material that is introduced between the housing components and optionally cured to form the watertight seal.

A watertight seal between housing components may also be formed by assembling a housing blank and machining the housing blank to form the housing. For example, the housing blank may include material for the housing components and material for a joint structure bonded together such that, when machined into a housing, the joint structure is properly positioned between housing components. The bonds between the various materials in the housing blank may be watertight, resulting in watertight interfaces between the housing components and joint structures in the final housing. Details of these and other housings, and methods of forming them, are discussed herein.

FIG. 1A shows an example electronic device 100. The electronic device 100 is a smartphone, but this is merely one representative example of an electronic device that may be used in conjunction with the ideas disclosed herein. Other example electronic devices include, without limitation, wearable electronic devices (such as the smartwatch shown in FIGS. 2A-2B), tablet computers, laptop computers, and the like.

The electronic device 100 includes a housing 104 and a cover 102, such as a glass, plastic, or other substantially transparent material, component, or assembly, attached to the housing 104. The cover 102 may cover or otherwise overlie a display and/or a touch sensitive surface (e.g., a touchscreen).

Figure 1B:
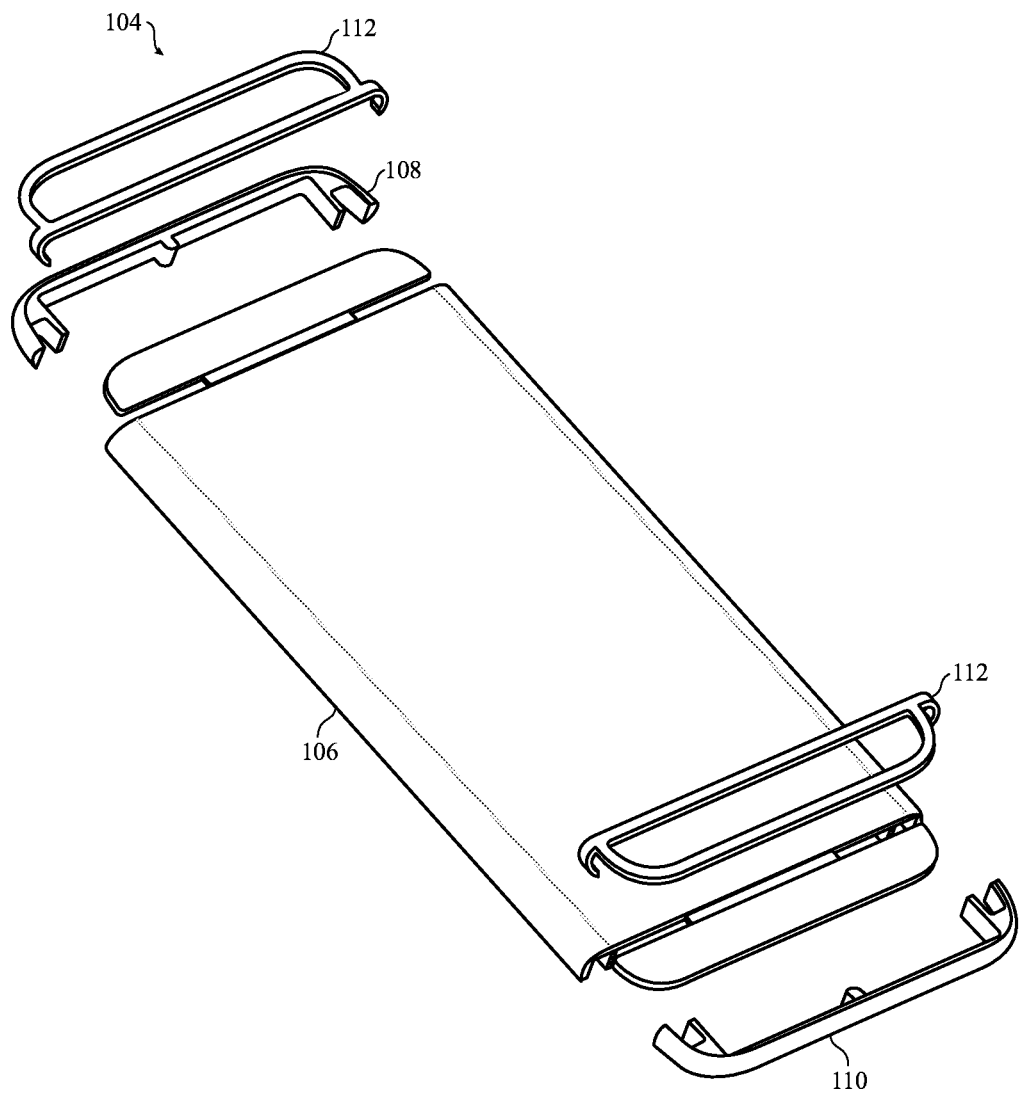
FIG. 1B shows an exploded view of a housing of the electronic device of FIG. 1A.

As shown, the housing 104 can be a multi-piece housing. For example, the housing 104 can be formed from a body portion 106 and end portions 108, 110 (FIG. 1B). The device 100 also includes internal components, such as processors, memory, circuit boards, batteries, sensors, and the like. Such components, which are not shown, may be disposed within an internal volume defined at least partially by the housing 104.

FIG. 1B shows an exploded view of the device 100. The housing 104 includes a body portion 106 and end portions 108, 110 (also referred to herein as a top portion 108 and a bottom portion 110). The body portion 106 and the end portions 108, 110 may be formed from any appropriate material, such as aluminum, titanium, amorphous metals, polymer, or the like. Any of the body portion 106 and/or the end portions 108, 110 may be part of an electrical circuit of the electronic device 100. In such cases, these components may be formed from or include conductive materials, and may be soldered or otherwise electrically coupled to an electrical circuit that is within the internal volume of the housing 104. As used herein, a component formed from a conductive material may be referred to as a conductive component.

The housing 104 also includes joint structures 112 between the body portion 106 and the top and bottom portions 108, 110. Joint structures 112, also referred to as intermediate structures or components, couple and/or retain one component to another component, and may form a watertight seal between the components that it joins or is adjacent to. For example, the joint structures 112 couple the end portions 108, 110 to the body portion 106, as described herein. The joint structure 112 may include multiple portions, segments, elements, layers, or the like. For example, a joint structure 112 may include a first element that mechanically retains the housing components together, and a second element that forms a watertight seal between the joint structure 112 and adjacent housing components, as described herein.

The joint structures 112 may be formed from or include any appropriate material. For example, joint structures 112 or portions thereof may be formed from polymers such as nylon, polyether ether ketone, polysulfone, polyphenylsulfone, polyaryletherketone, polyetherimide, polyethersulfone, or any other appropriate material. Moreover, the joint structures 112 may be reinforced with reinforcing fibers of glass, carbon, or any other appropriate material. The joint structures 112 may also be formed from or include ceramics, such as zirconia, alumina, or any other ceramic material.

Exterior surfaces of the joint structures 112 may form a continuous surface with exterior surfaces of other housing components. Alternatively, the exterior surfaces of the joint structures 112 may be recessed from or proud of portions of the housing 104 that are adjacent the joint structures 112. Further, the exterior surfaces of the joint structures 112 may be configured to blend in with other portions of the housing 104. For example, the joint structures 112 may be the same color as nearby portions of the housing 104, may have the same surface finish/texture as exterior portions of the housing 104, or the like. As described herein, the exterior surfaces of the joint structures 112 and the housing 104 may be co-finished. In other words, the joint structures 112 and the housing 104 may be subjected to the same finishing processes (e.g., grinding, machining, or polishing) to produce a continuous surface extending across the joint structures 112 and adjacent portions of the housing 104, as well as to produce a similar surface finish and/or appearance on the joint structures 112 and the housing 104.

The body portion 106 and/or the end portions 108, 110 may be part of an electrical circuit of the device 100. For example, one or both of the end portions 108, 110 may be an antenna, or a portion of an antenna, for wireless communication (e.g., cellular, Wi-Fi, Bluetooth, and so on). Where an end portion is an antenna, or is otherwise part of an electrical circuit, it may be necessary or desirable to electrically and/or capacitively isolate that end portion from other portions of the housing 104, such as the body portion 106. Accordingly, the joint structures 112 may be formed from or include an electrical insulator to electrically and/or capacitively isolate the housing components from each other while also coupling them together to form a structurally sound and watertight housing 104. In some embodiments, the roles of the housing components may be reversed such that a joint structure 112 is configured to act as an antenna or other circuit component. In such cases, the joint structure 112 may be formed from or include a conductive material, and the body portion 106 and/or the end portions 108, 110 of the housing 104 may be formed from a nonconductive material, or may otherwise be electrically isolated from the joint structure 112. The electronic device 100 may also or instead include antennas positioned within the housing and proximate the joint structures 112 (or embedded in the joint structures 112). In such cases, the joint structures 112 may be formed from nonconductive materials to facilitate the passage of wireless signals through the housing 104 and to (and from) the internal antennas.

Figure 2A:
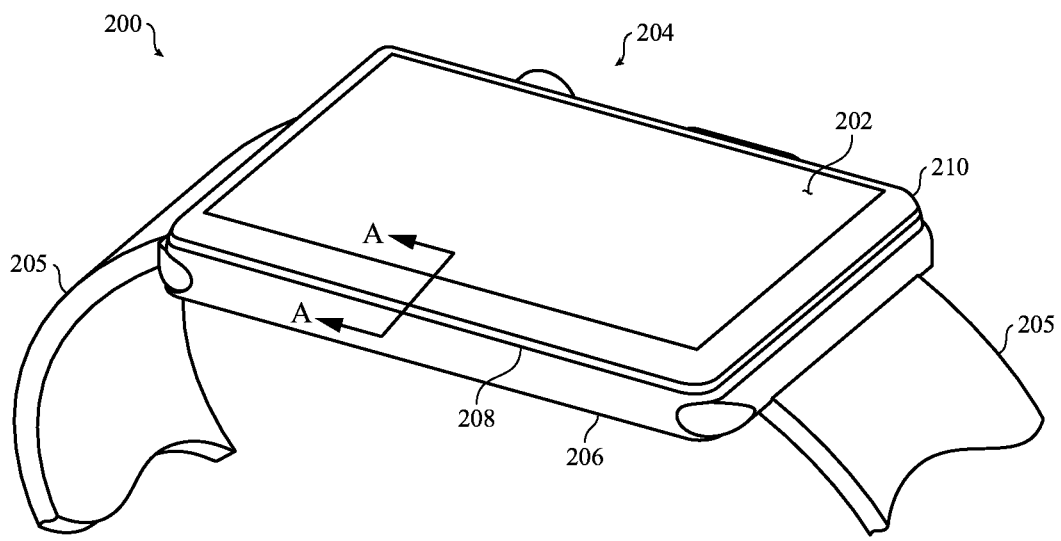
FIG. 2A shows an example electronic device.

FIG. 2A shows an example electronic device 200 having a different housing configuration than the electronic device 100. As shown in FIG. 2A, the electronic device 200 is a smartwatch, but this is merely one example of an electronic device that may use the housings described herein. Other example electronic devices include, without limitation, smartphones, tablet computers, laptop computers, other wearable devices, and the like.

The electronic device 200 includes a housing 204 and a cover 202, such as a glass, plastic, or other substantially transparent material, component, or assembly, attached to the housing 204. The cover 202 may cover a display and/or a touch sensitive surface (e.g., a touchscreen). The device 200 also includes a strap or band 205 for attaching the device 200 to a user (e.g., to a user's wrist).

As shown, the housing 204 can be a multi-piece housing. For example, the housing 204 can be formed from a lower housing component 206 and an upper housing component 210. The device 200 also includes internal components, such as processors, memory, circuit boards, batteries, sensors, and the like (not shown), which may be disposed within an internal volume defined at least partially by the housing 204.

Figure 2B:
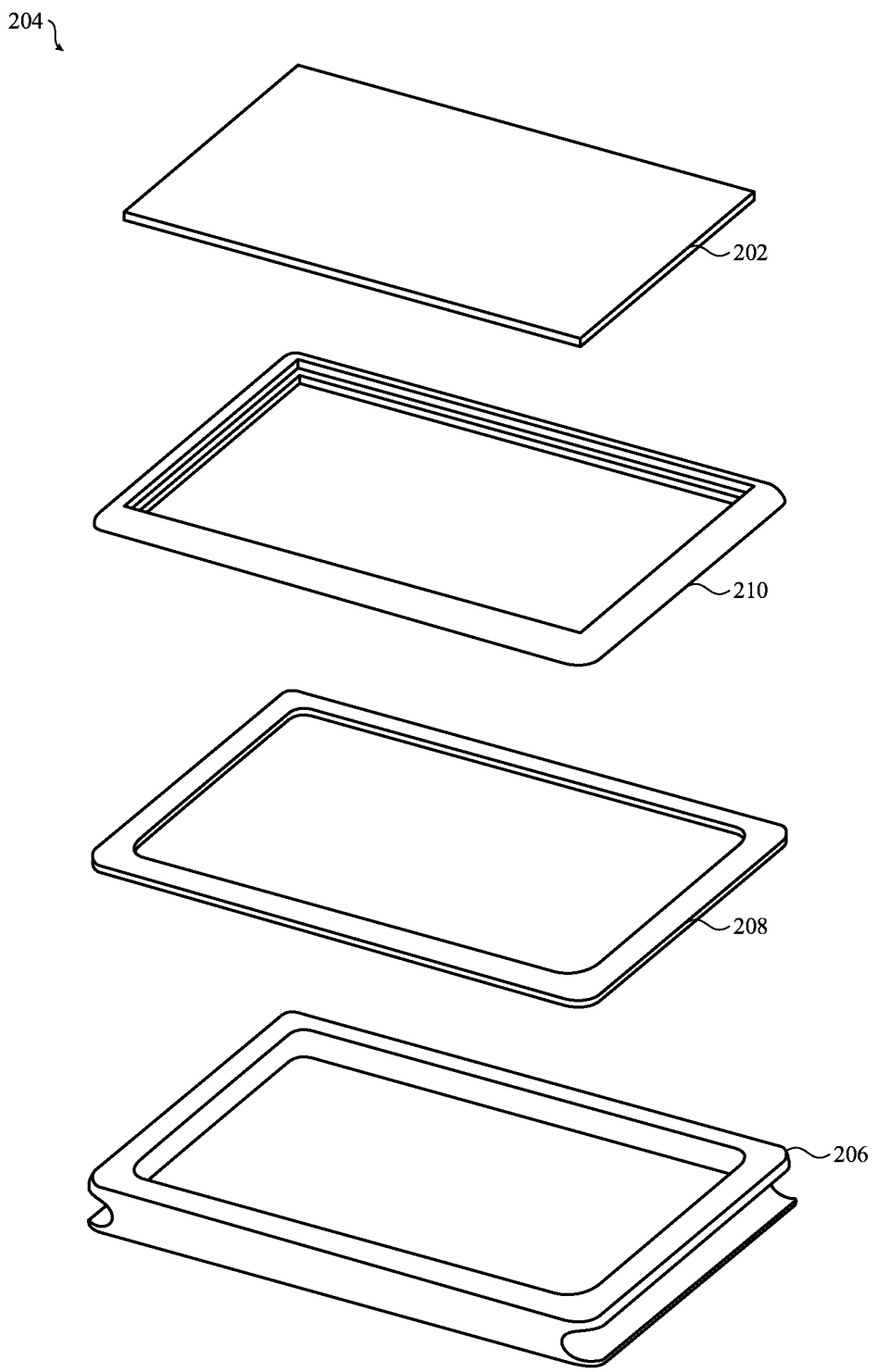
FIG. 2B shows an exploded view of a housing of the electronic device of FIG. 2A.

FIG. 2B shows an exploded view of the device 200. The housing 204 includes a lower housing component 206, a joint structure 208, an upper housing component 210, and a cover 202. The upper and lower housing components 206, 210 may be formed from any appropriate material, such as aluminum, titanium, amorphous metals, polymer, or the like. Either or both of the upper and lower housing components 206, 210 may be part of an electrical circuit of the electronic device 100 (e.g., they may act as antennas for a wireless communication circuit), and as such may be conductive components that are formed from or include conductive materials. Where a housing component is part of an electrical circuit, the housing component may be soldered or otherwise electrically coupled to the electrical circuit. Similar to the discussion above, the joint structure 208 may be electrically operative instead of the housing components, in which case the joint structure 208 may be formed from or include a conductive material, and the housing components 206, 210 may be formed from or include a nonconductive material (or they may otherwise be electrically isolated from the joint structure 208). Also, as noted above, a nonconductive joint structure 208 may facilitate the passage of wireless signals through the housing 204 to reach antennas that are positioned within the housing 204 or embedded in the joint structure 208.

Figure 12A:
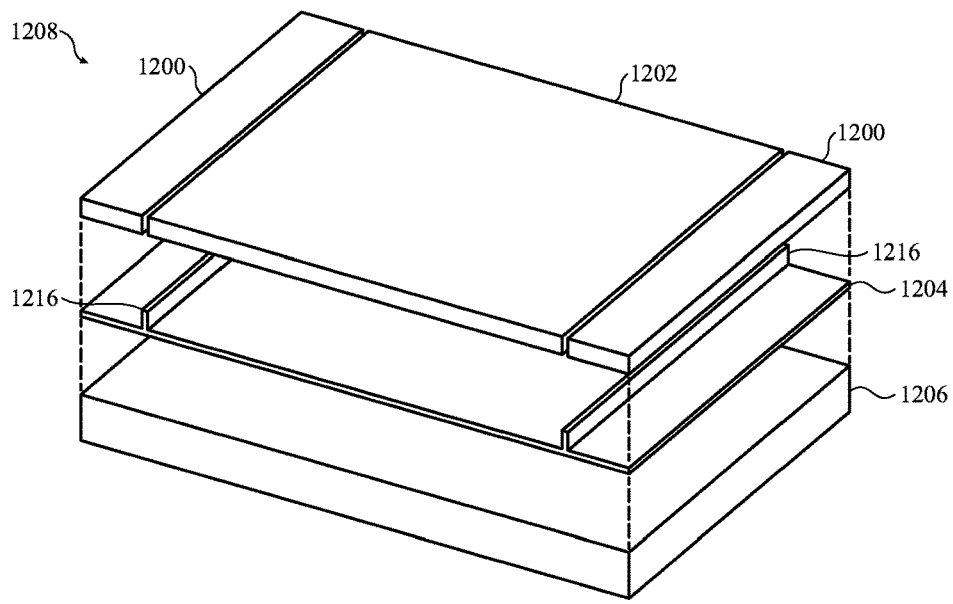
FIGS. 12A-12C show an example process of forming another example housing.
Figure 12B:
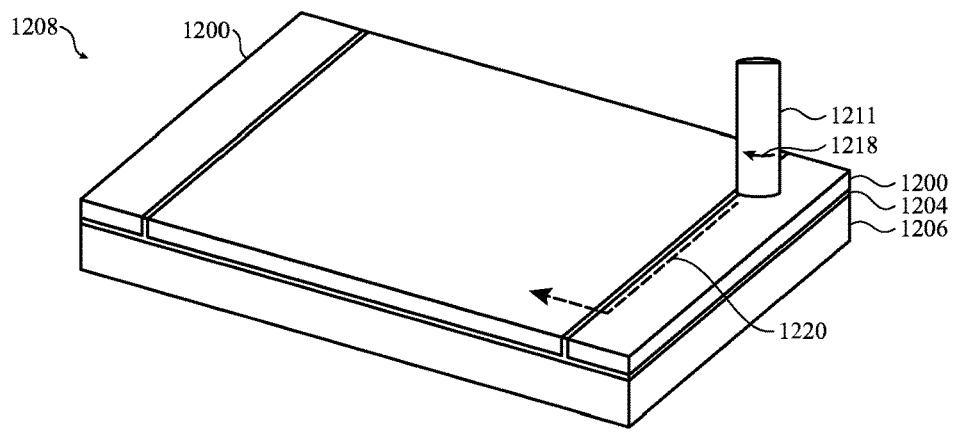
Figure 12C:
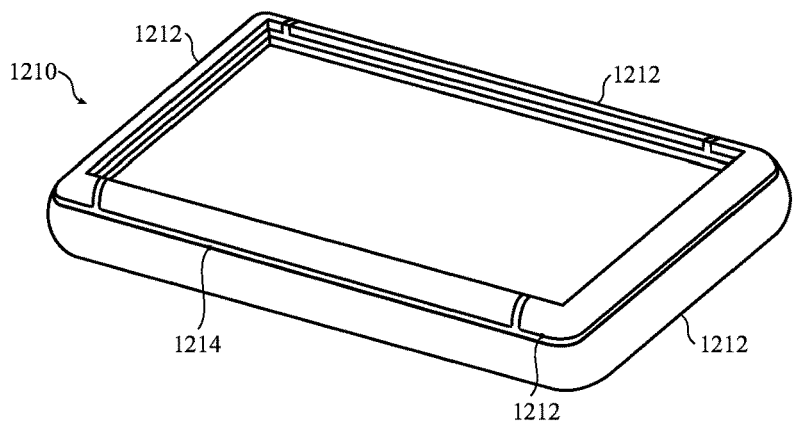

Returning to FIG. 2B, the housing 204 includes a joint structure 208 between the upper and lower housing components 206, 210. Similar to the joint structures 112 described above, the joint structure 208 couples and/or retains the upper housing component 206 to the lower housing component 210. The joint structure 208 is one example joint structure that may be used in the electronic device 200. More particularly, the joint structure 208 is a substantially frame-like component that joins the upper and lower housing components 206, 210 along a plane that is substantially coplanar with the cover 202. However, other embodiments or implementations of the housing 204 may have different configurations and geometries of housing components and joint structures, such as housing components that are separated from one another along joints that are substantially perpendicular to the cover 202. For example, the housing 104 (FIGS. 1A-1B) includes joint structures with segments that are substantially perpendicular to the cover 102. A similar structure may be employed in the housing 204. FIG. 12C illustrates another housing with an alternative joint structure. Indeed, joint structures as described herein may be used between any housing components or portions, not merely those specific examples that are depicted in the figures.

The joint structures 112 (FIGS. 1A-1B) and the joint structure 208 (FIGS. 2A-2B), as well as the components or portions of the housings 104 and 204 may be similar in materials, function, construction, methods of manufacturing, etc. Accordingly, any discussion of a joint structure or housing component for a given electronic device applies equally to the joint structures or housing components of other electronic devices. Moreover, while FIGS. 3-12C illustrate example joint structures for the electronic device 200, the same geometries, materials, electrical characteristics, functions, and manufacturing methods may be applied to the joint structures of the electronic device 100 or of any appropriate electronic device.

Figure 3:
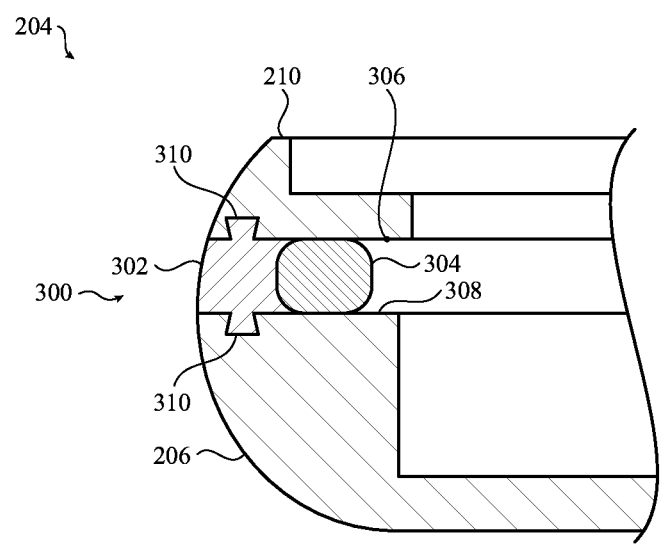
FIG. 3 shows a partial cross-sectional view of the housing of FIG. 2A viewed along line A-A in FIG. 2A, showing an example joint structure.

FIG. 3 is a partial cross-sectional view of the electronic device 200 viewed along line A-A of FIG. 2A, illustrating one example configuration of a joint structure that may provide a watertight seal between housing components. Other components of the device 200, such as the cover 202, a battery, a display, etc. are omitted from FIG. 3 (as well as other figures) for clarity.

FIG. 3 shows a joint structure 300 that includes a molded element 302 and a sealing member 304. The molded element 302 and the sealing member 304 are positioned between an interface surface 306 of the upper housing component 210 and an interface surface 308 of the lower housing component 206. The interface surfaces 306, 308 face one another, and may be substantially parallel.

The upper housing component 210 and/or the lower housing component 206 may be formed from or include a conductive material, and may be part of an electrical circuit of the electronic device 200. In such cases, the joint structure 300, including the molded element 302 and the sealing member 304, may be formed from an electrical insulator or nonconductive material such that the sealing member 304 and the molded element 302 electrically isolate the lower housing component 206 from the upper housing component 210.

The upper and lower housing components 210, 206 may include interlock features 310 with which the molded element 302 engage to retain the upper and lower housing components 210, 206 to the molded element 302, and thus to each other. As shown in FIG. 3, the interlock features 310 are trapezoidal channels (similar to "dovetail" channels) with angled surfaces that prevent the housing components 210, 206 and the molded element 302 from separating from one another. Other interlock features may be used instead of or in addition to the trapezoidal channels shown in FIG. 3. For example, the housing components may include channels, pins, protrusions, surfaces, textures, recesses, or any other feature or element that engages the molded element 302 to retain the housing components 210, 206 together.

The interlock features 310 may extend continuously around a perimeter of the housing 204. Alternatively, the housing 204 may include a plurality of discrete interlock features that do not extend around the entire housing 204. The housing 204 may also include different interlock features (or an absence of interlock features) at various positions, such as trapezoidal channels along one side of the housing 204 (as shown in FIG. 3) and pins along another side of the housing 204 (e.g., a side of the housing 204 opposite the side shown in FIG. 3). The interface surfaces 306, 308 may have different interlock features 310 as well. For example, the interface surface 306 may include trapezoidal channels (as shown in FIG. 3), and the interface surface 308 may include different interlock features, such as pins, a trapezoidal protrusion, or the like. Moreover, the housing 204 may include multiple interlock features 310 along a given molded element/housing component interface. For example, two trapezoidal channels may be formed in one or both of the interface surfaces 306, 308.

In some cases, the interlock features 310 may be omitted. For example, the molded element 302 may be fixed to the housing components 210, 206 via an adhesive or an adhesive-like bond, such as where the molded element 302 is a polymer that includes an adhesive or otherwise forms a bond with the housing components 210, 206 despite the absence of macro-scale interlock features. A separate adhesive may also or instead be applied to the housing components 210, 206 and/or the molded element 302 to retain the molded element 302 to the housing components 210, 206.

The molded element 302 may form a portion of an exterior surface of the housing 204. In some cases, the molded element 302 may form a continuous or substantially continuous surface with adjacent portions of the upper and lower housing components 210, 206. That is, the seams between the upper and lower housing components 210, 206 and the molded element 302 may lack a visibly or tactilely perceptible gap, and may generally define a continuous geometric shape (e.g., without drastic or abrupt cavities, channels, seams, gaps, or the like, at the seams).

As noted above, the molded element 302 may be co-finished with adjacent portions of the upper and lower housing components 210, 206, which may include grinding, polishing, machining, or other operations. In some cases, the molded element 302 may be formed so that the outer surface is recessed relative to the exterior surfaces of the housing components, and material may be removed from the housing components to form a flush and/or continuous surface across the housing components and the molded element 302. In such cases, tools used for finishing the housing components may not contact (or may only incidentally contact) the molded element, thus reducing the possibility of damage to the molded element 302 from the tools. A further buffing, polishing, or other finishing operation that is less likely to cause damage to the molded element 302 may still be applied to the molded element 302 and/or the housing components 210, 206 after material is removed from the housing components.

In some embodiments, the molded element 302 may not form a watertight seal between the upper and lower housing components 210, 206. For example, the molded element 302 may be formed by introducing (e.g., injecting) a flowable polymer material into a gap between the upper and lower housing components 210, 206. When the polymer is cured, it may contract, effectively pulling the molded element 302 out of intimate contact with the housing components 210, 206 in at least some interfacing portions. These areas may allow water, liquid, or other contaminates to enter the housing 204 and potentially damage internal components of the electronic device 200. Where the molded element 302 does not reliably produce watertight seals, or to provide a secondary or backup seal, the housing 204 may include a sealing member 304 positioned on an interior side of the molded element 302. The sealing member 304 may be configured to intimately contact the interface surfaces 306, 308 of the housing components to form a watertight seal between the upper and lower housing components 210, 206. Moreover, as discussed herein, the molded element 302 and the sealing member 304 may abut one another, which may eliminate or reduce the occurrence of voids or gaps in the joint structure 300 and/or between the joint structure 300 and the housing components 210, 206.

The sealing member 304 may be formed from or include an elastomeric material that provides suitable sealing properties, such as a rubber, silicone, or the like. The sealing member 304 may resemble a gasket or an O-ring that substantially surrounds the housing 204 and seals the upper and lower housing components 210, 206.

In some cases, the sealing member 304 is compressed between the housing components 210, 206 in order to maintain intimate contact between the sealing member 304 and the housing components 210, 206. That is, a distance between the housing components 210, 206 may be smaller than a thickness of the sealing member 304 in an uncompressed or "resting" state. Once compressed between the housing components, the sealing member 304 will attempt to expand to its uncompressed or resting thickness, thereby forcing itself against the interface surfaces 306, 308. This interaction may form or contribute to a watertight seal.

By forming the joint structure 300 from multiple components (e.g., the molded element 302 and the sealing member 304), the functions of the joint structure 300 may be shared among different components. This may allow for fewer design compromises for the joint structure 300. For example, a joint structure 300 may be desired to securely retain the housing components together, electrically isolate the housing components, form a watertight seal, form a suitably hard and durable surface, withstand chemical and mechanical finishing processes to which the exterior surface of the housing is subjected (e.g., grinding, polishing, anodizing), and satisfy aesthetic or cosmetic requirements (e.g., be capable of being dyed to desired colors or have an attractive visual appearance). In some cases, these design considerations may compete, such that improving the performance in one aspect (e.g., sealing) may reduce the performance in another (e.g., hardness and durability). By providing a separate sealing element, it may be possible to provide a joint structure 300 that is better in several respects than one formed of only a single material or structural element. For example, the molded element 302 may be formed from or include a material that is hard, durable, and securely retains the housing components together, while the sealing member 304 may be formed from a softer material that forms a watertight seal but which may be too soft to be used as an exterior surface of the housing 204.

In some cases, the molded element 302 may form a watertight seal with the adjacent surfaces of the housing components 210, 206. In such cases, the sealing member 304 may be omitted, or may be used as a secondary sealing member. Molded elements that form a watertight seal may be formed from or include ceramics, epoxies, cermets, or composites (including combinations of polymers, ceramics, epoxies, adhesives, and the like).

Figure 4A:
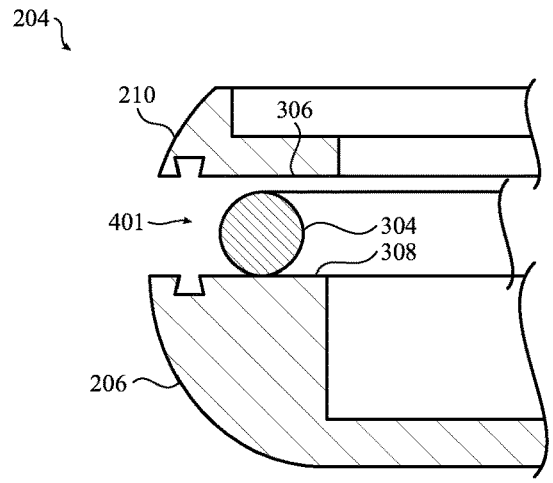
FIGS. 4A-4C show partial cross-sectional views of the housing of FIG. 2A viewed along line A-A in FIG. 2A, illustrating an example process of forming the joint structure of FIG. 3.
Figure 4B:
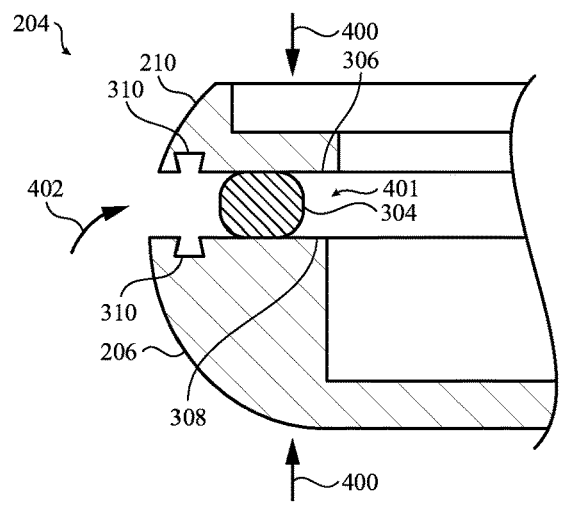
Figure 4C:
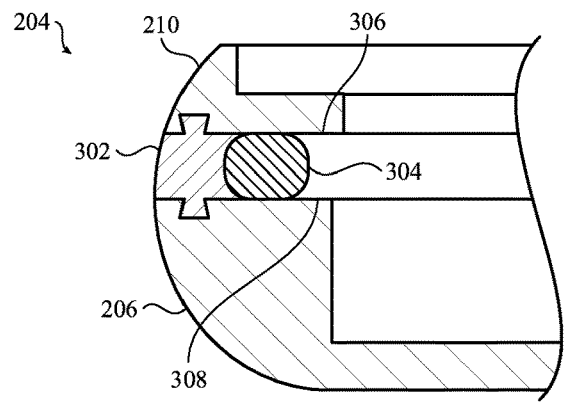

FIGS. 4A-4C are partial cross-sectional views of the housing 204 viewed along A-A in FIG. 2A, showing an example process of forming the joint structure 300 described above. In FIG. 4A, the sealing member 304 is positioned in a gap 401 between the upper and lower housing components 210, 206. As shown, the sealing member 304 is placed on the interface surface 308 of the lower housing component 206. In some cases, the sealing member 304 may be placed on the upper housing component 210, or part of the sealing member 304 may be placed on each of the housing components. The sealing member 304 is shown having a round cross-section, though a sealing member of any shape or size may be used.

The sealing member 304 may be any appropriate structure, component, or material. For example, the sealing member 304 may be a pre-formed gasket, O-ring, or other component that is positioned between (or a portion of which is positioned between) the housing components 206, 210. As another example, the sealing member 304 may be formed by flowing or otherwise depositing a deformable material on one of the housing components 206, 210. The deposited deformable material may be cured to form a resilient or deformable structure, or may be suitable for sealing without curing. Suitable deformable materials for the sealing member may include foams, rubbers, silicone, wax, polyurethane, neoprene, and so on.

After the sealing member 304 or deformable material is positioned in the gap 401 (or after the sealing member 304 or deformable material is otherwise placed in a suitable position, such as on an interface surface of a housing component), a force 400, represented in FIG. 4B by arrows, may be applied to one or both of the housing components 206, 210. The force compresses the sealing member 304 or deformable material in a first portion of the gap 401 that is proximate an internal volume of the housing 204, thereby forming a seal between the surfaces of the sealing member 304 and the interface surfaces 306, 308 of the housing components 206, 210. The seal formed by the sealing member 304 or deformable material may be a watertight seal, as described above. As shown in FIGS. 4A-4B, the sealing member 304 or deformable material changes shape in response to being compressed, though the particular shapes and changes in size, shape, and aspect ratio shown in the figures are for representation and may not correspond to an actual implementation.

The force 400 may be produced by placing the upper and lower housing components 210, 206 in a jig, mold, clamp, or other fixture after the sealing member 304 is properly positioned. The fixture may hold the housing components 210, 206 in a spaced apart orientation such that the gap 401 is formed and the sealing member 304 is compressed between the housing components. A shim, spacer, or other component (not shown) may also be positioned in the gap 401 or otherwise between the upper and lower housing components 210, 206 to establish and maintain the gap size during further processing. For example, the shim, spacer, or other component may be positioned in the gap 401 before the sealing member 304 is compressed in the gap 401, and may cooperate with a jig, mold, clamp, or other fixture to define and maintain the size of the gap 401. The shim may be any appropriate size or shape, such as a continuous shim that extends along the entire gap (though not necessarily filling the entire gap), or a smaller shim that extends along only a part of the gap. Moreover, multiple shims may be used, such as one shim for each linear portion of the housing 204, or one shim for each corner of the housing 204, or, in the case of a circular housing, three shims spaced 120 degrees apart around the housing. Other shims and shim arrangements are also contemplated.

The jig, mold, clamp, or other fixture may also define mold surfaces that substantially cover and/or enclose the external opening of the gap 401 and define a shape of an exterior surface of the molded element 302. Accordingly, the joining material may flow against the mold surfaces when it is introduced into the gap 401, thereby forming a molded element 302 with an exterior surface corresponding to the mold surfaces. More particularly, the mold surfaces may define a contour or shape that will result in the molded element 302 having an exterior surface that is continuous with adjacent portions of the housing.

After the sealing member 304 is compressed, a joining material may be injected, flowed, or otherwise introduced into a second portion of the gap 401 that is proximate an exterior surface of the housing or generally outboard from the sealing member 304 to form the molded element 302 (as represented by arrow 402, FIG. 4B). The joining material may flow into, around, and/or against the interlock features 310 to form complementary shapes and/or structures in the material, as shown in FIG. 4C. Similarly, the joining material may flow against and abut the sealing member 304, forming a shape that is complementary to the sealing member 304. The joining material may adhere to or otherwise bond to the sealing member 304. The intimate contact between the joining material and the sealing member 304 may reduce or eliminate voids in the joint structure 300 (and in particular between the molded element 302 and the sealing member 304), thereby producing a more secure or watertight seal between the housing components 210, 206. Indeed, such voids or gaps may cause liquids to be drawn into the voids via capillary action, which may increase the likelihood of liquid ingress into the housing 204 or other damage to the housing 204 and/or the joint structure 300.

The joining material may also flow against mold surfaces to define an exterior surface of the molded element 302, which is also an exterior surface of the housing 204. The joining material is then cured, thereby solidifying or hardening the joining material and forming the molded element 302. Where a shim or spacer is used to maintain the size of the gap 401, it may be removed after the joining material is cured, as the cured material retains the housing components together and maintains the size of the gap 401.

Because the joining material is introduced into the gap 401 and cured while the sealing member 304 is compressed between the housing components, the sealing member 304 may remain in a compressed state after the force is removed. That is, once the joining material is introduced into the gap and cured to form the molded element 302, the size of the gap 401 is maintained such that a residual compressive force is maintained on the sealing member 304, thus providing a positive contact between the sealing member 304 and the housing components.

After the molded element 302 is at least partially cured, the housing 204 may be subjected to further finishing or processing steps. For example, the housing 204 may be anodized, chemically treated, plated, washed, or the like. As another example, the housing 204 may be subjected to machining, grinding, or polishing. Such finishing and processing steps may be applied to the housing components 210, 206 (which may be metal), as well as the molded element 302 (which may be a polymer). In particular, a grinding, machining, or polishing step may include traversing the exterior surface of the housing 204 with an appropriate tool, including traversing along the upper housing component 210, the molded element 302, and the lower housing component 206 in a continuous path. Accordingly, the molded element 302 may be formed from a material that can be subjected to the same finishing or processing steps as the housing components. For example, if the housing components 206, 210 are to be ground and polished in order to achieve a desired surface finish, the molded element 302 may be formed from a material that, when subjected to the same grinding and polishing operations as the housing components 206, 210, produces a desirable surface finish (e.g., it does not chip, crack, or melt, and produces a smooth or otherwise desirable surface).

FIGS. 5A-5D are partial cross-sectional views of the housing 204 viewed along line A-A in FIG. 2A, showing another example process of forming the joint structure 300 described above. The process illustrated in FIGS. 5A-5D is similar to that described with respect to the process illustrated in FIGS. 4A-4C, but illustrates a process where the upper and lower housing components 210, 206 are fixed to one another by a joining member to define and/or substantially maintain the size of the gap until the molded element 302 (and/or the sealing member 304) is formed and cured.

Figure 5A:
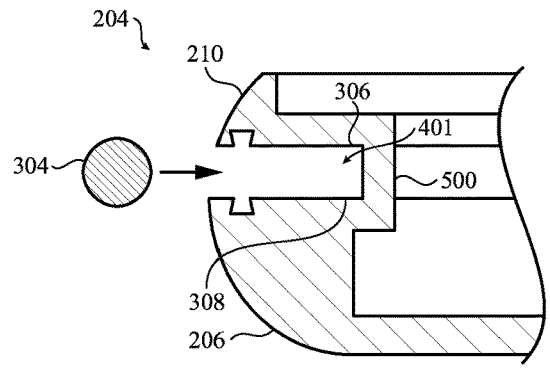
FIGS. 5A-5D show partial cross-sectional views of the housing of FIG. 2A viewed along line A-A in FIG. 2A, illustrating another example process of forming the joint structure of FIG. 3.

FIG. 5A shows the upper housing component 210 fixed to the lower housing component 206 via a joining member 500. As shown, the joining member 500 and the upper and lower housing components 210, 206 are a single monolithic component. In other embodiments (not shown), the joining member may be a separate piece of material that is bonded or otherwise attached to the upper and lower housing potions 210, 206. The joining member 500 may extend continuously around an entire inner perimeter of the internal volume of the housing 204 (e.g., completely enclosing the inner opening of the gap 401). Alternatively, the joining member 500 may be a segment of material that does not extend around the entire housing 204. In some cases, multiple joining members 500 may be distributed at various locations around the perimeter of the interior volume of the housing 204.

Figure 5B:
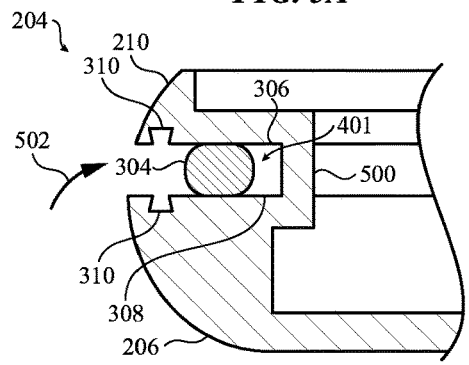
Figure 5C:
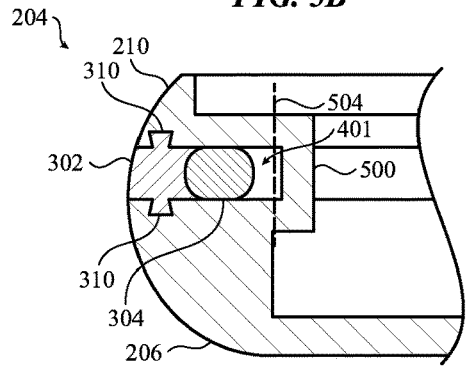

While the joining member 500 is maintaining the size of the gap, the sealing member 304 may be introduced or pressed into the gap 401, as shown in FIG. 5B. For clarity, only a portion of the sealing member 304 is shown in FIG. 5A. For example, the sealing member 304 may be an O-ring or otherwise form a continuous loop, and segments of the loop that would be visible in the background in FIG. 5A are omitted for clarity. In some cases, however, the sealing member 304 may not form a continuous loop. For example, multiple discrete sealing members 304 may be positioned along the interface between the upper and lower housing components 210, 206.

In its relaxed or uncompressed state, the sealing member 304 (or other deformable material) may be taller than the gap 401. Accordingly, when pressed or forced into the gap 401, the sealing member 304 is compressed between the upper and lower housing components 210, 206, thereby forming a watertight seal between the sealing member 304 and the interface surfaces 306, 308 of the housing components 210, 206. As noted above, the sealing member 304 may be an O-ring, gasket, or other piece of material (e.g., deformable material) that can be fit into the gap 401. Where the gap 401 extends around a perimeter of the housing 204, the sealing member 304 may be a continuous elastomeric gasket that is stretched to fit around the outer edge, and then returns to a resting size to draw itself into the gap 401.

Instead of compressing a larger sealing member 304 into a smaller gap 401, the sealing member 304 may be formed from or include an expanding material, such as a polymer material that can be introduced into the gap 401 and then expanded to form a watertight seal with the interface surfaces 306, 308. For example, a propellant such as pressurized gas or a chemical that decomposes to form a gas may be mixed with or otherwise incorporated in an expandable polymer material. Once the material is introduced in the gap 401, the propellant may cause the material to expand and force the material against the interface surfaces 306, 308.

After the sealing member 304 is introduced into the gap 401, the housing 204 may be introduced into a mold or other apparatus having mold surfaces that cover the opening of the gap 401. Material (e.g., a joining material) is then flowed, injected, or otherwise introduced into the gap 401 (as represented by arrow 502, FIG. 5B). The joining material may flow into, around, and/or against the interlock features 310 to form complementary structures in the material, and may also flow against the mold surfaces to define an exterior surface of the molded element 302. Other aspects of the molded element 302 as well as the process of forming the molded element 302 are described above, and apply equally to the process described with respect to FIGS. 5A-5D. For example, the molded element 302 may contact and/or abut the sealing member 304 and form a complementary surface against the sealing member 304.

Figure 5D:
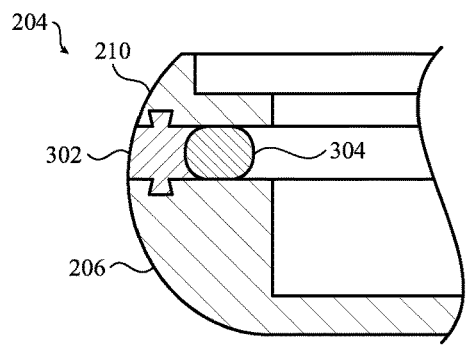

After the material forming the molded element 302 is cured and the molded element 302 has retained the upper and lower housing components 210, 206 together, the joining member 500 may be removed. For example, a machining or cutting operation (e.g., laser, plasma, or water jet cutting) may cut along the line 504 in FIG. 5C to remove the joining member 500. Because the sealing member 304 and the molded element 302 are electrical insulators, removing the joining member 500 electrically decouples the upper and lower housing components 210, 206. FIG. 5D illustrates the housing 204 after the joining member 500 is removed.

In some cases, it may be useful to electrically couple one housing component to another housing component. For example, an antenna design may call for the housing components to be physically separated from one another at certain locations (optionally with the joint structure 300 therebetween), and electrically coupled at other locations. In housings where the housing components are to be electrically coupled at certain locations, the joining member 500 (or other joining members) may not be removed, thus providing the desired electrical connection between the housing components.

Figure 6:
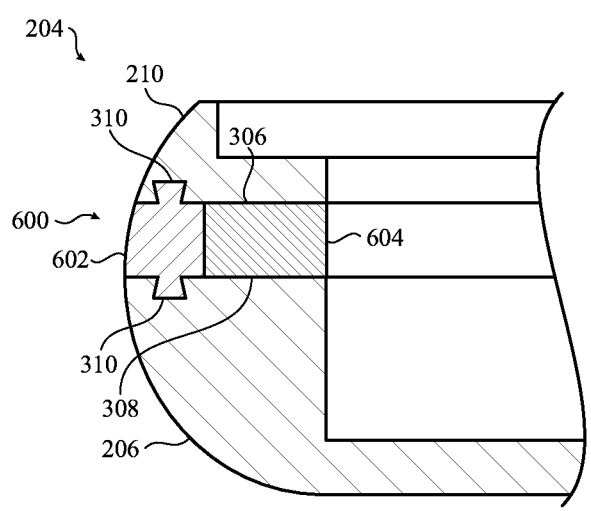
FIG. 6 shows a partial cross-sectional view of the housing of FIG. 2A viewed along line A-A in FIG. 2A, showing another example joint structure.

FIG. 6 shows a joint structure 600 that includes a first molded element 602 and a sealing member 604 that is a second molded element. The joint structure 600 may be an alternative to the joint structure 300, but may otherwise perform the same or similar functions as the joint structure 300, including mechanically retaining housing components together, electrically isolating the housing components, and forming a watertight seal between the housing components.

The first molded element 602 is similar to the molded element 302 described above. For example, the first molded element 602 may be formed from the same materials and using the same techniques (e.g., injecting or flowing a polymer material into the gap 401 and against mold surfaces that define the exterior edge of the molded element 602). The first molded element 602 may also have the same or similar structure and perform the same or similar functions as the molded element 302. For example, the first molded element 602 may engage interlock features of the upper and lower housing components 210, 206.

The second molded element 604 may perform the same or similar functions as the sealing member 304. For example, the second molded element 604 may form a watertight seal between the upper and lower housing components 210, 206. Instead of compressing a preformed sealing member or material (e.g., to deform the material and rely on the residual force of the sealing member to form the watertight seal), the second molded element 604 may be molded in-place in a manner similar to the molded element 302.

Figure 7A:
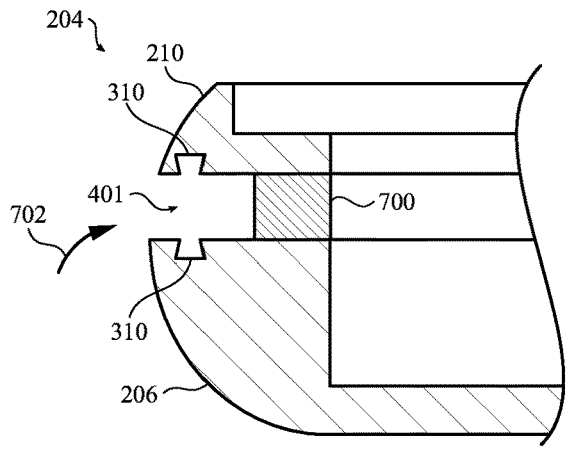
FIGS. 7A-7C show partial cross-sectional views of the housing of FIG. 2A viewed along line A-A in FIG. 2A, illustrating an example process of forming the joint structure of FIG. 6.
Figure 7B:
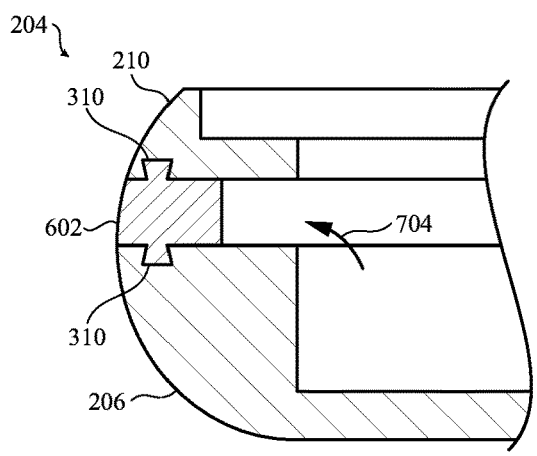
Figure 7C:
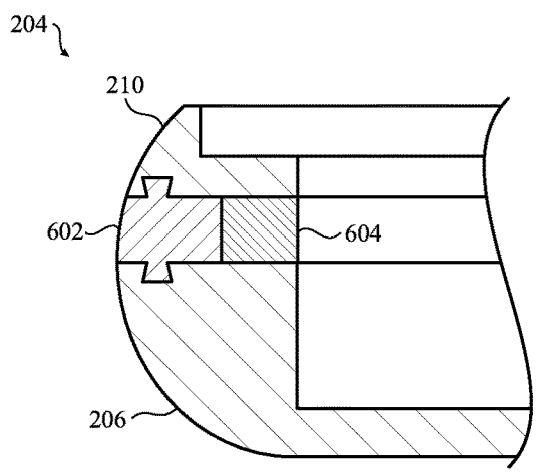

FIGS. 7A-7C are partial cross-sectional views of the housing 204 viewed along line A-A in FIG. 2A, showing an example process of forming the joint structure 600 described above. Aspects of the process illustrated in FIGS. 7A-7C may be similar to or the same as the process illustrated in FIGS. 4A-4C and 5A-5D. For clarity, those details may be omitted from the discussion of FIGS. 7A-7C, but it will be understood that they apply equally to this process.

In FIG. 7A, a spacer 700 is positioned between the upper and lower housing components 210, 206 to support the housing components in a spaced-apart configuration. For example, the spacer 700 may be positioned in a portion of the gap 401 that is proximate an internal volume of the housing 204. The spacer 700 may thus support the housing components to define the size of the gap 401 and also occupy a portion of the gap 401 that will later be filled with the second molded element 604.

After the spacer 700 is positioned in the gap 401, the first molded element 602 is formed in the portion of the gap 401 that is proximate the exterior surface of the housing 204. For example, a first material (e.g., a joining material) may be flowed, injected, or otherwise introduced into the gap 401 (as represented by arrow 702, FIG. 7A). The first material may flow into, around, and/or against the interlock features 310 to form complementary shapes and/or structures in the first material, and may also flow against the mold surfaces to define an exterior surface of the first molded element 602. Aspects of the molded element 302 as well as the process of forming the molded element 302 are described above with respect to the molded element 302 and apply equally to the first molded element 602 and to the process of forming the first molded element 602.

After the first molded element 602 is at least partially cured, the spacer 700 may be removed from the gap 401 to expose the portion of the gap 401 that is proximate the internal volume of the housing 204 (e.g., an interior portion of the gap 401). A second material is then flowed, injected, or otherwise introduced into the interior portion of the gap (as represented by arrow 704, FIG. 7B) and subsequently cured, thereby forming the second molded element 604. The second material flows against and is bounded on one side by an inner surface of the first molded element 602. Once cured, the second material may form a watertight seal between the upper and lower housing components 210, 206.

Like the molded element 302 and the sealing member 304 shown in FIGS. 3-5D, the first and second molded elements 602, 604 may abut one another in the gap 401. In particular, when the second material is introduced into the interior portion of the gap (FIG. 7B), the material flows against and conforms to the surface of the first molded element 602. Thus, the second molded element 604 forms a complementary surface that abuts the first molded element 604, reducing or eliminating voids, cavities, or gaps in the joint structure 600.

The first and second molded elements 602, 604 may be designed to provide different functions to the housing 204, and thus may be formed from different materials. For example, the first molded element 602 may be configured to rigidly retain the upper and lower housing components 210, 206 together while being sufficiently hard and durable to act as an exterior surface of the device. On the other hand, the second molded element 604 may be configured to form a watertight seal between the housing components, and its structural rigidity and impact toughness may be less critical. In some cases, the first material does not substantially bond to the interface surfaces of the housing components 210, 206, and thus may permit liquid or other contaminants to pass between the first molded element 602 and the interface surfaces. In such cases, the second molded element 604 (e.g., the sealing member) may be formed from an epoxy, glue, adhesive, or other material that does form a watertight bond with the interface surfaces.

FIGS. 8A-8D are partial cross-sectional views of the housing 204 viewed along line A-A in FIG. 2A, showing another example process of forming the joint structure 600 described above. Whereas the process shown in FIGS. 7A-7C uses the spacer 700 to occupy the portion of the gap 401 that is ultimately occupied by the sealing member 604, the process shown in FIGS. 8A-8D includes filling that portion of the gap 401 with material of the first molded element 602, and then removing some of the material to form a space for the sealing member 604.

Figure 8A:
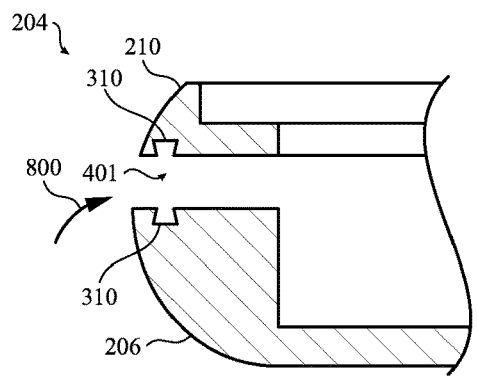
FIGS. 8A-8D show partial cross-sectional views of the housing of FIG. 2A viewed along line A-A in FIG. 2A, illustrating another example process of forming the joint structure of FIG. 6.

For example, as shown in FIG. 8A, the upper and lower housing components 210, 206 may be positioned relative to each other to define the gap 401. This may include placing the housing components 210, 206 in a mold, jig, or other fixture, as described above. Alternatively or additionally, the upper and lower housing components 210, 206 may be joined by a joining member, such as the joining member 500 (FIG. 5A). The first material (e.g., a joining material) may then be flowed, injected, or otherwise introduced into the gap 401 (as represented by arrow 800), which may include flowing the first material against interlock features 310, as described above. The first material may substantially fill the gap 401, or may otherwise occupy more of the gap 401 than is necessary or desirable for the final dimension of the first molded element 602. The first material is then cured or hardened.

Figure 8B:
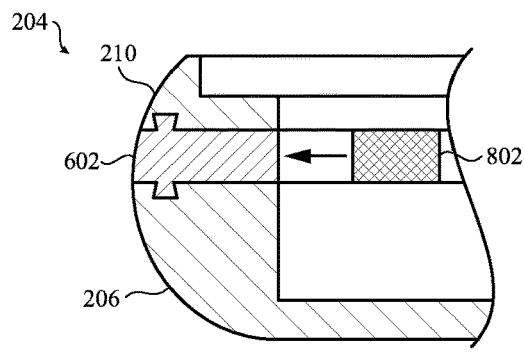
Figure 8C:
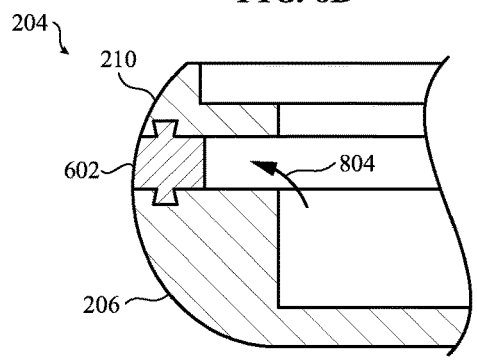
Figure 8D:
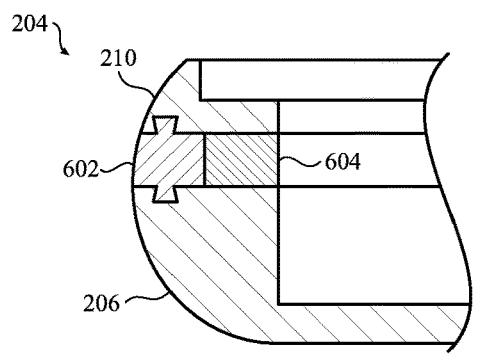

Once the first material is at least partially cured or hardened, at least part of the hardened material is removed from the interior portion of the gap 401, thereby forming a final interior dimension and/or shape of the first molded element 602. The first material may be removed by any appropriate process. For example, as shown in FIG. 8B, a cutting or grinding tool 802 may be used to remove a portion of the first material that is proximate the internal volume of the housing 204, thus forming space in the gap 401 for the second molded element 604 or other sealing member to be positioned or formed. Other techniques, including chemical etching, laser cutting, water cutting, or the like may be used instead of or in addition to grinding or machining.

After the first material is removed from the interior portion of the gap 401, a second material (e.g., a sealing material) is flowed, injected, or otherwise introduced into the now vacant interior portion of the gap (as represented by arrow 804, FIG. 8C) and subsequently cured. The second material flows against and is bounded on one side by an inner surface of the first molded element 602. Once cured, the second material may form a watertight seal between the upper and lower housing components 210, 206.

While not shown in FIGS. 6-8D, the housing components 210, 206 may include additional interlock features that engage the second molded element 604. Such interlock features may be the same or similar to the interlock features 310, described above. Moreover, such interlock features may be shaped or otherwise configured to help prevent the ingress of water or other liquids into the internal volume of the housing 204. For example, the interlock features may include flutes, ridges, splines, saw-tooth channels, or the like.

Figure 9:
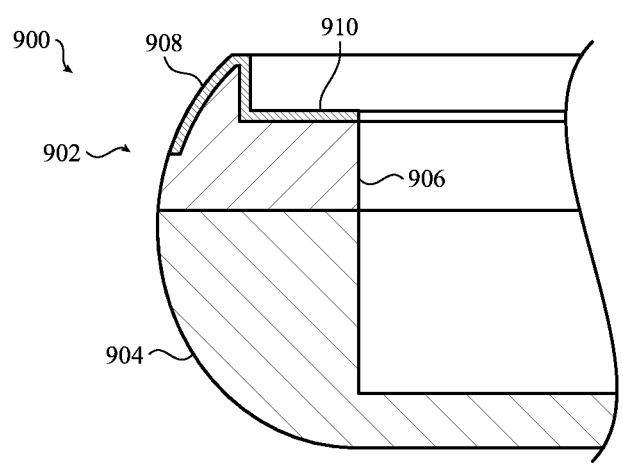
FIG. 9 shows a partial cross-sectional view of an example housing, viewed along line A-A in FIG. 2A.

FIG. 9 is a partial cross-sectional view of a housing 900 that may be used in the electronic device 100 or 200. The housing 900 may be similar to the housing 204 described above, and may provide similar functionality. For example, one or more of the components of the housing 900 may be part of an electrical circuit of an electronic device. More particularly, one or more of the components of the housing 900 may be an antenna or form part of an antenna for a wireless communication circuit. The cross-sectional view in FIGS. 9-10D may correspond to a view of the housing 900 along a line similar to line A-A in FIG. 2A.

The housing 900 includes an upper housing component 902 and a lower housing component 904. The lower housing component 904 may be substantially the same as the lower housing component 206 (shown in FIGS. 2A-8D). The upper housing component 902 may have an external appearance that is the same or similar to the upper housing component 210 and the joint structure 208 (FIG. 2A), but may have a different mechanical structure. In particular, instead of a separate housing component and joint structure, as described in the foregoing examples, the upper housing component 902 includes a structural member 906 and a coating 908 on at least a portion of the structural member 906. The structural member 906 may be a polymer or other nonconductive material, and the coating 908 may be a metallic or conductive material.

The upper housing component 902 may be configured to support a cover, such as the cover 202 (FIG. 2), and form a watertight seal between the upper housing component 902 and the cover 202. For example, the upper housing component 902 may define a surface 910 on which the cover 202 (or another component) is supported. The surface 910 may be part of the coating 908 (as shown in FIG. 9), or it may be part of the structural member 906. For example, the portion of the coating 908 defining the surface 910 in FIG. 9 may be omitted, and the structural member 906 may be exposed instead.

When a cover is coupled to the surface 910, a watertight seal may be formed between the cover and the surface 910. For example, a gasket, adhesive, or other sealing material may attach the cover to the surface 910 and seal the interface between the cover and the surface 910.

As shown in FIG. 9, a portion of the structural member 906 forms a portion of the exterior surface of the housing 900, as does the coating 908. In some cases, a portion of each of the coating 908, the structural member 906, and the lower housing component 904 form a substantially continuous surface. For example, the seams between the structural member 906 and the coating 908, and between the structural member 906 and the lower housing component 904 may lack gaps, grooves, or other surface discontinuities or irregularities, such that the exterior surface of the housing 900 is a continuous and/or smooth surface.

In some cases, both the lower housing component 904 and the coating 908 may be formed from or include a conductive material, such as metal, aluminum, stainless steel, or the like. The structural member 906 may be formed from a nonconductive material, such as a polymer, ceramic, or the like. The nonconductive material of the structural member 906 electrically isolates the conductive coating 908 from the conductive lower housing component 904. This may allow the coating 908 and/or the lower housing component 904 to be used in electrical circuits of an electronic device, as described above. For example, by electrically isolating the conductive coating 908 from the conductive lower housing component 904, the conductive coating 908 may be able to function as an antenna for a wireless communications or radio circuit. Also, because the coating 908 is electrically isolated from the lower housing component 904, it may be easier to optimize the size, shape, materials, or other properties of the coating 908 for use as an antenna without having to consider the electrical effect of the remaining portions of the housing on the antenna performance.

The structural member 906 may be coupled to the lower housing component 904 using an adhesive or other bonding agent that forms a watertight seal therebetween. For example, an epoxy, cyanoacrylate, heat-sensitive adhesive (HAS), pressure-sensitive adhesive (PSA), or the like, may be used to form a watertight seal.

Figure 10A:
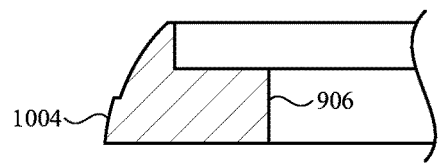
FIGS. 10A-10D show partial cross-sectional views of the housing of FIG. 9, illustrating an example process of forming the housing of FIG. 9.

FIGS. 10A-10D are partial cross-sectional views of the housing 900 (or portions thereof), showing an example process of forming the housing 900. FIG. 10A illustrates the structural member 906. The structural member 906 may be formed by molding (e.g., injection molding) a polymer material, such as a polymer that is an electrical insulator.

Figure 10B:
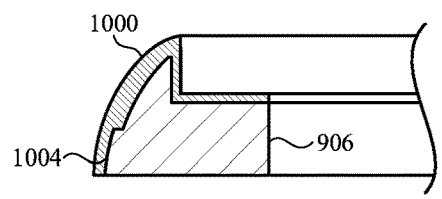

At least a portion of the structural member 906 may then be coated with a conductive material 1000, as shown in FIG. 10B. The conductive material 1000 may be coated on portions of the structural member 906 that ultimately form an exterior surface of the housing 900 and/or the electrical device that uses the housing 900. In some cases, the conductive material 1000 may be or may include the same material as the lower housing component 904. For example, the conductive material 1000 and the lower housing component 904 may both be or include aluminum, stainless steel, copper, or the like. In some cases, the conductive material 1000 and the lower housing component 904 are different materials that have similar visual and/or tactile properties (e.g., surface finish, color, and texture). In other cases, the conductive material 1000 differs from the material of the lower housing component 904 in these or other respects.

The conductive material 1000 may be coated on, deposited on, or otherwise applied to the structural member 906 in any appropriate way. For example, the conductive material 1000 may be applied to the structural member 906 by chemical vapor deposition, physical vapor deposition, printing (e.g., ink-jet printing with metallic inks), plating (e.g., electroplating, electroless plating), laser direct structuring, and the like. Where laser direct structuring is used, the structural member 906 may be formed from a material that is doped with a metal-plastic additive. A laser beam is then directed on the portions of the structural member 906 where the conductive layer 908 is to be formed, thereby forming a metal or metallized surface on the structural member 906. The metal or metallized surface may then be further metallized using a plating technique such as electroplating or electroless plating to build the conductive layer 908 to a desired thickness.

The upper housing component 902 may be coupled to the lower housing component 904. For example, an adhesive or bonding agent may be applied to one or both of the upper and lower housing components 902, 904, and the housing components may be brought into contact with each other. The adhesive or bonding agent may be selected so that the joint between upper and lower housing components 902, 904 is watertight. Example adhesives include epoxy, cyanoacrylate, heat-sensitive adhesive (HAS), pressure-sensitive adhesive (PSA), or the like, may be used to form a watertight seal. In order to securely bond the lower housing component 904 to the structural member 906, force may be applied to the structural member 906 and/or the lower housing component 904 after the adhesive is applied, such as with a clamp, vacuum bag, or other apparatus. The upper and lower housing components 902, 904 may be coupled together before or after the conductive layer 908 is formed on the structural member 906.

Figure 10C:
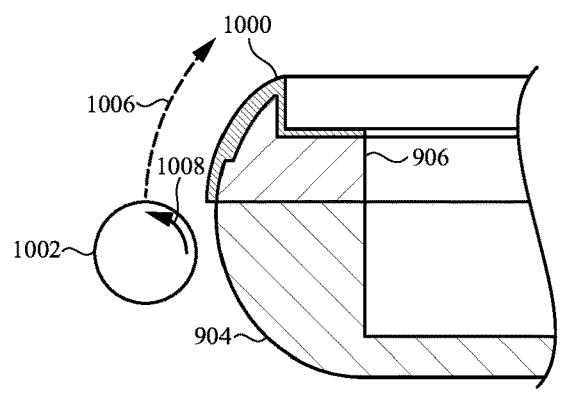
Figure 10D:
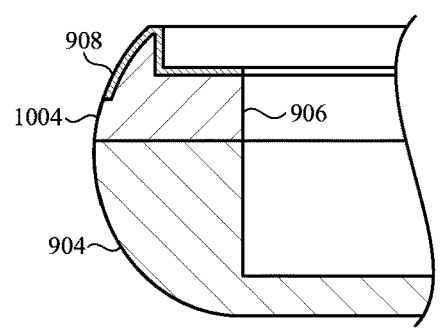

The coating of the conductive material 1000 that is formed on the structural member 906 may be thicker than a desired final thickness of the conductive layer 908. In such cases, some of the conductive material 1000 may be removed with further processing or finishing operations to achieve a desired thickness. For example, as shown in FIG. 10C, a tool 1002 may be used to grind or otherwise remove excess conductive material. The machining operation may remove all of the conductive material 1000 in a certain location to expose the underlying structural member 906. For example, the structural member 906 may define a protruding feature 1004 that is flush with adjacent portions of the lower housing component 904 and the conductive layer 908 when the conductive material 1000 is removed therefrom. When the finishing operation is complete, the protruding feature 1004 may appear visually as a joint structure that is between an upper metal portion and a lower metal portion, despite the upper metal portion being a coating on the structural member 906, as shown in FIG. 10D.

The tool 1002 may be used to co-finish the lower housing component 904 and the upper housing component 902. In particular, the same machining operation may be used along at least part of the lower housing component 904, the conductive coating 908, and the structural member 906 to produce a substantially uniform texture and/or appearance across the various different components and materials that define the exterior surface of the housing 900. As shown in FIG. 10C, the co-finishing operation may include moving a rotating machine tool 1002 (as indicated by the arrow 1008) along a path 1006, which will bring the tool into contact with the lower housing component 904, the conductive coating 908, and the structural member 906.

Figure 11A:
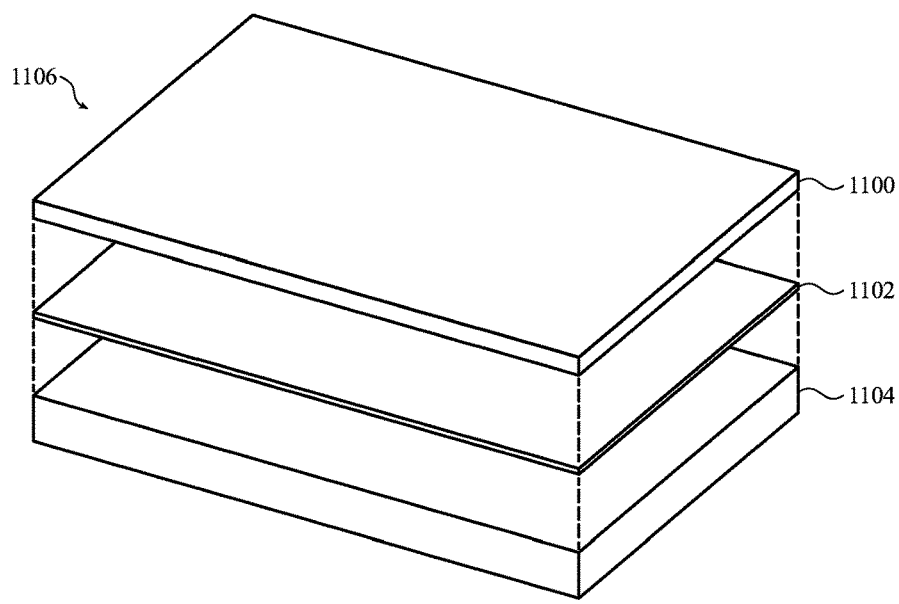
FIGS. 11A-11C show an example process of forming another example housing.
Figure 11B:
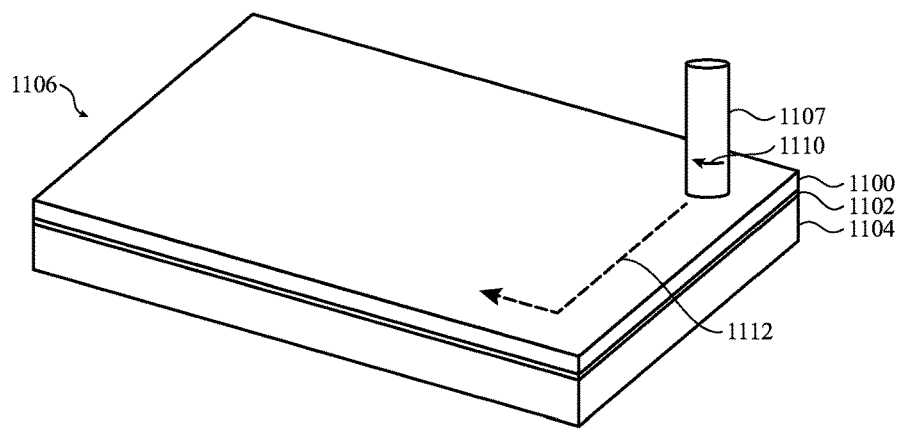
Figure 11C:
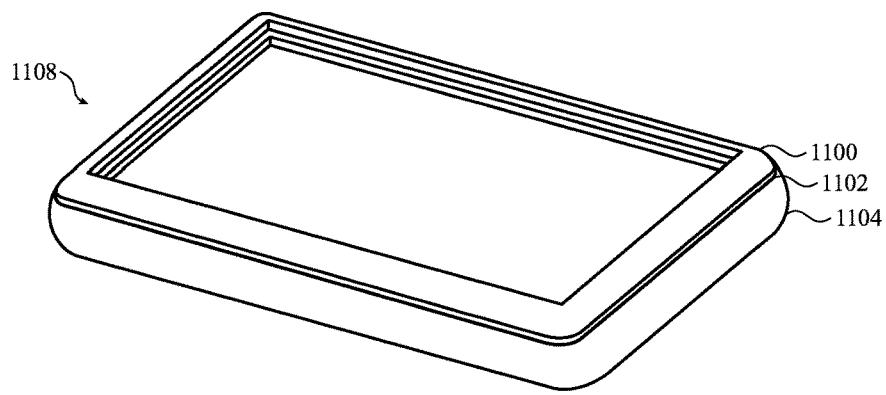

FIGS. 11A-11C show a process for forming a housing that includes conductive housing components that are electrically isolated from each other by a joint structure. In particular, the process includes forming a housing blank that includes material from which the housing is to be formed in a pre-assembled configuration. More particularly, with reference to FIGS. 11A-11B, a housing blank may be formed by bonding a first conductive component 1100, a nonconductive component 1102, and a second conductive component 1104 together to form a housing blank 1106. The first and second conductive components 1100, 1104 may be formed from or include any appropriate conductive material, such as aluminum, steel, or the like. The nonconductive component 1102, which may ultimately electrically isolate portions of the housing 1108 (FIG. 11C) from one another, may be formed from or include any appropriate nonconductive material, such as nylon, polyether ether ketone, polysulfone, polyphenylsulfone, polyaryletherketone, polyetherimide, polyethersulfone, or any other appropriate material.

The first and second conductive components 1100, 1104 may be bonded to the nonconductive component 1102 in any appropriate way. For example, an adhesive or other bonding agent may be applied to the components which are then laminated to form the housing blank 1106. In order to securely bond the conductive and nonconductive components, a force may be applied to the components after the adhesive is applied, such as with a clamp, vacuum bag, or other apparatus. Alternatively, the first and second conductive components 1100, 1104 may be held in a spaced apart configuration and a material may be flowed, injected, or otherwise introduced between the conductive components 1100, 1104. The material may then be cured to form the nonconductive component 1102 and bond the material to the conductive components 1100, 1104. Other potential techniques for bonding the first and second conductive components 1100, 1104 to the nonconductive component 1102 include diffusion bonding, ultrasonic welding, torsion welding, linear ultrasonic welding, insert molding, and friction welding.

The bond between the conductive components 1100, 1104 and the nonconductive component 1102 may be watertight. Thus, once the housing 1108 (FIG. 11C) is formed from the housing blank 1106, the housing 1108 itself may be watertight, at least along the seams or interfaces between the conductive components 1100, 1104 and the nonconductive component 1102.

After the housing blank 1106 is formed, material is removed from the housing blank 1106 to form a housing 1108 (FIG. 11C) having an exterior surface and an internal volume to receive electrical components, such as batteries, processors, and the like. Removing the material may include machining the housing blank 1106 with a tool 1107, or any other appropriate process or operation such as laser ablation, plasma cutting, grinding, or the like. For example, as shown in FIG. 11B, the tool 1107, such as an end mill, may rotate as indicated by arrow 1110 and move along the path 1112 to at least partially define the inner volume. Other machining or material removal operations may also be used to form other aspects of the housing 1108, such as the angled interior corners of the internal volume and the rounded exterior surface.

The housing blank 1106 is configured such that, after material is removed to form the housing 1108, a remaining portion of the nonconductive component 1102 electrically isolates remaining portions of the first and second conductive components 1100, 1104 from each other. For example, electrical isolation of the conductive components 1100, 1104 may be useful where the portions of the conductive components 1100, 1104 that remain after the machining operation act as an antenna or other component of an electrical circuit, as described above. Moreover, similar to the housings described above, at least portions of the first and second conductive components 1100, 1104 as well as at least a portion of the nonconductive component 1102 may define an exterior surface of the housing 1108 after the housing blank 1106 is machined to form the housing 1108.

FIGS. 11A-11C illustrate one example housing blank 1106 and housing 1108 that may be formed from the housing blank 1106. Where other geometries of a housing are desired, such as a different arrangement of housing components and joint structures, housing blanks having different structures may be used. For example, FIGS. 12A-12C show a process for forming a housing that is similar to the process described with respect to FIGS. 11A-11C, except the housing blank 1208 (FIG. 12B) and the housing 1210 produced therefrom (FIG. 12C) have a different structure. In particular, as shown in FIG. 12C, the housing 1210 includes conductive housing components 1212. Each conductive housing component is electrically isolated from the others by the joint structure 1214, and may be used as an antenna or other component of an electrical circuit. In order to form the housing 1210 with conductive components having a desired shape, size, and position, the housing blank 1208 is configured to have a corresponding structure.

With reference to FIG. 12A, the housing blank 1208 may be formed by bonding conductive components 1200, 1202, and 1206 to a nonconductive component 1204. The nonconductive component may have protrusions, beams, arms, or other features that extend between the conductive components 1200, 1202, 1206 to ensure electrical isolation between those components. As shown, beams 1216 project from a base of the nonconductive component 1204 and are each positioned between two conductive components. These features may result in joint structures positioned in desired positions between housing components in the final housing 1210.

As shown in FIG. 12B, the housing blank 1208 may be machined or otherwise have material removed (e.g., with the tool 1211 or any other appropriate material removal operation) to form the internal volume and exterior surface of the housing blank 1208, as shown in FIG. 12C. For example, as shown in FIG. 12B, the tool 1211, such as an end mill, may rotate as indicated by arrow 1218 and move along the path 1220 to at least partially define the inner volume. Other machining or material removal operations may also be used to form other aspects of the housing 1210, such as the angled interior corners of the internal volume and the rounded exterior surface.

The molded elements described herein may be formed by molding (including, for example, injecting) a material into gaps between housing components. However, the molded elements, or portions thereof, may be formed in other ways as well, and are not necessarily limited to any particular manufacturing or forming process. For example, one or more of the molded elements may be formed separately from other housing components (using any appropriate process, such as extruding, machining, or the like) and positioned in the gaps after the molded elements are formed.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. For example, while the methods or processes disclosed herein have been described and shown with reference to particular operations performed in a particular order, these operations may be combined, subdivided, or re-ordered to form equivalent methods or processes without departing from the teachings of the present disclosure. Moreover, structures, features, components, materials, steps, processes, or the like, that are described herein with respect to one embodiment may be omitted from that embodiment or incorporated into other embodiments.

What is claimed is:

1. A housing for an electronic device, comprising:
   a first conductive component defining:
      a first portion of a curved exterior surface of the housing;
      a first interface surface; and
      a first interlock feature;
   a second conductive component defining:
      a second portion of the curved exterior surface of the housing;
      a second interface surface facing the first interface surface; and
      a second interlock feature; and
   a joint structure between the first and second interface surfaces, comprising:
      a molded element defining:
         first and second corresponding interlock features engaged with the first and second interlock features, respectively, and fixing the first conductive component to the second conductive component; and
         a third portion of the curved exterior surface of the housing, the third portion positioned between and adjacent to the first and second portions of the curved exterior surface; and
      a sealing member abutting the molded element and forming a watertight seal between the first and second conductive components.

2. The housing of claim 1, wherein:
the sealing member and the molded element are electrical insulators; and
the sealing member and the molded element electrically isolate the first conductive component from the second conductive component.

3. The housing of claim 1, wherein:
the first and second interlock features are dovetail channels.

4. The housing of claim 1, wherein the sealing member comprises an elastomeric material.

5. The housing of claim 1, wherein the sealing member is compressed between the first and second interface surfaces.

6. The housing of claim 1, wherein:
the molded element is a first molded element; and
the sealing member is a second molded element.

7. The housing of claim 1, wherein the curved exterior surface of the housing is located at a perimeter of the housing.

8. An electronic device, comprising:
a display;
a cover over the display; and
a housing configured to receive the display and the cover, comprising:
a first component receiving the cover thereon and defining:
a first exterior surface region of the housing; and
a first interlock feature;
a second component forming at least part of an interior cavity of the housing and defining:
a second exterior surface region of the housing; and
a second interlock feature; and
a joint structure positioned in a gap between the first and second components, comprising:
a molded element mechanically engaged with the first and second interlock features to inhibit expansion of the gap, the molded element defining a third exterior surface region between the first and second exterior surface regions; and
an elastomeric sealing member abutting the molded element and between the first and second components; wherein
the third exterior surface region, a portion of the first exterior surface region adjacent the molded element, and a portion of the second exterior surface region adjacent the molded element together define a continuous surface.

9. The electronic device of claim 8, wherein:
the first and second components are formed of a conductive metal;
the elastomeric sealing member and the molded element are electrical insulators; and
the elastomeric sealing member and the molded element electrically isolate the first component from the second component.

10. The electronic device of claim 8, wherein:
the first interlock feature comprises a channel extending around a perimeter of the electronic device.

11. The electronic device of claim 10, wherein the channel is a dovetail channel.

12. The electronic device of claim 8, wherein the elastomeric sealing member is subject to a residual compressive force by the first and second components.

13. The electronic device of claim 8, wherein:
the first component defines an opening configured to receive the display and the cover therein; and
the elastomeric sealing member extends around a perimeter of the opening.

14. The electronic device of claim 8, wherein the molded element is formed of a polymer material.

15. The electronic device of claim 8, wherein the molded element conforms to a shape of the elastomeric sealing member.

* * * * *